(12) United States Patent
Geffin et al.

(10) Patent No.: US 10,852,357 B2
(45) Date of Patent: Dec. 1, 2020

(54) SYSTEM AND METHOD FOR UPS BATTERY MONITORING AND DATA ANALYSIS

(71) Applicant: LIEBERT CORPORATION, Columbus, OH (US)

(72) Inventors: Steven Geffin, Miami, FL (US); Gregory W. Ratcliff, Delaware, OH (US); Edward W. Deveau, Pompano Beach, FL (US)

(73) Assignee: Vertiv Corporation, Columbus, OH (US)

(*) Notice: Subject to any disclaimer, the term of this patent is extended or adjusted under 35 U.S.C. 154(b) by 449 days.

(21) Appl. No.: 14/787,796

(22) PCT Filed: May 5, 2014

(86) PCT No.: PCT/US2014/036812
§ 371 (c)(1),
(2) Date: Oct. 29, 2015

(87) PCT Pub. No.: WO2014/179801
PCT Pub. Date: Nov. 6, 2014

(65) Prior Publication Data
US 2016/0109526 A1   Apr. 21, 2016

Related U.S. Application Data

(60) Provisional application No. 61/819,317, filed on May 3, 2013.

(51) Int. Cl.
*G01R 31/36* (2020.01)
*G05B 13/04* (2006.01)
(Continued)

(52) U.S. Cl.
CPC ....... *G01R 31/3648* (2013.01); *G01R 31/367* (2019.01); *G05B 13/04* (2013.01); *H02J 9/06* (2013.01); *G01R 31/389* (2019.01)

(58) Field of Classification Search
CPC ....... G05B 13/0295; G05B 13/04; H02J 9/06; G01R 31/3662
(Continued)

(56) References Cited

U.S. PATENT DOCUMENTS 5,568,450 A * 10/1996 Grande .................. G01S 7/527
367/131
6,064,180 A    5/2000 Sullivan et al.
(Continued)

FOREIGN PATENT DOCUMENTS

CA        2448460 A1    11/2002
CN      102623761 A     8/2012
(Continued)

OTHER PUBLICATIONS

Ratcliff, Gregory W. "Detecting Changes in Readings from Remote Battery Systems", Proceedings of the 19th ISSAT International Conference on Reliability and Quality in Design, Aug. 5-7, 2013, 5 pages.

(Continued)

*Primary Examiner* — Sujoy K Kundu
*Assistant Examiner* — L. Anderson
(74) *Attorney, Agent, or Firm* — Harness, Dickey & Pierce, P.L.C.

(57) ABSTRACT

A system and method is disclosed for analyzing a set of collected raw data point values and determining which one or ones of the values are erroneous data values. In one implementation of the method specific ones of the values are examined to determine if they are outliers, and if so they are removed from the data set. At least two other ones of the values obtained at points in time prior to a given one of the values are examined. Weights may be assigned to the at least two other values, and the weights used to help generate a predicted data point value. The predicted data point value is (Continued)

compared to the given one of the values to determine if the given one of the values is an erroneous value. In this way the integrity of each data point value in the set can be checked.

17 Claims, 17 Drawing Sheets

(51) Int. Cl.
*H02J 9/06* (2006.01)
*G01R 31/367* (2019.01)
*G01R 31/389* (2019.01)

(58) Field of Classification Search
USPC ......... 702/52, 56, 85, 279, 185, 189; 703/17
See application file for complete search history.

(56) References Cited

U.S. PATENT DOCUMENTS

| | | |
|---|---|---|
| 6,329,792 B1 | 12/2001 | Dunn et al. |
| 7,554,294 B2 | 6/2009 | Srinivasan et al. |
| 8,332,342 B1 | 12/2012 | Saha et al. |
| 2003/0014205 A1 | 1/2003 | Tabor |
| 2003/0144810 A1 | 7/2003 | Tabor |
| 2004/0267477 A1 | 12/2004 | Scott et al. |
| 2006/0085155 A1 | 4/2006 | Miguelanez et al. |
| 2006/0186890 A1 | 8/2006 | Iwane et al. |
| 2007/0088534 A1* | 4/2007 | MacArthur ........ G05B 13/0295 703/17 |
| 2008/0183408 A1 | 7/2008 | Matsuura et al. |
| 2010/0250162 A1 | 9/2010 | White et al. |
| 2010/0265051 A1 | 10/2010 | Sivertsen |
| 2011/0219327 A1 | 9/2011 | Middleton, Jr. et al. |

FOREIGN PATENT DOCUMENTS

| | | |
|---|---|---|
| CN | 102778653 A | 11/2012 |
| JP | 2001351698 A | 12/2001 |
| JP | 2005-285614 A | 10/2005 |
| JP | 2006038747 A | 2/2006 |

OTHER PUBLICATIONS

Ratcliff, Gregory W. "Data Cleansing for Remote Battery System Monitoring", Battcon 2013 Stationary Battery Conference and Trade Show, May 2013, pp. 18-1-18-9.

Pachano, Liz Aranguren, et al. "Survey of Data Cleansing and Monitoring for Large-Scale Battery Backup Installations", 12th International Conference on Machine Learning and Applications (ICMLA), Dec. 2013; http://ieeexplore.ieee.org/document/6786156/?reload=true.Jan. 17, 2017, 1 page.

Supplementary European Search Report and the European Search Opinion in corresponding European Application No. 14791732 dated Dec. 6, 2016, 9 pages.

Second Office Action and Search Report issued by SIPO in corresponding Chinese Patent Application No. 201480025188.3 dated Dec. 4, 2017, 17 pp.

First Office Action and Search Report issued by Chinese State Intellectual Property Office in corresponding patent application 2014800251883, dated May 2, 2017, 7 pages.

International Search Report and Written Opinion of the International Searching Authority for PCT/US2014/036812, dated Aug. 27, 2014; ISA/KR.

* cited by examiner

```
1  Sort instances in S according to feature X (transforming all
   values of X into a sortable format if necessary first, e.g. if X is
   a date format)
2  tempS ← Empty Dataset
3  tempS[0] ← S[0]
4  for i from 1 to N − 1 do
5      for j from 0 to F − 1 do
6          if S[i − 1][j] ≠ S[i][j] then
7              Append S[i] to tempS
8              break 9  S ← tempS
10 Errors ← Empty Array
11 Errors[0] ← n/a
12 Errors[1] ← n/a
13 for i from 2 to N − 1 do
14     trainS ← Empty Dataset
15     for j from 0 to i − 1 do
16         trainS[j] ← S[j]
17     Weights ← Empty Array
18     if |S[i][X] − S[i − 1][X]| > 2628000 then
19         WeightFactor ← |S[i][X] − S[i − 1][X]| − 2628000
20     else
21         WeightFactor ← 0
22     for j from 0 to i − 1 do
23         Weights[j] ←
             exp((−(|S[j][X] − S[i][X]| − WeightFactor)) ÷ A)
24     Model ← WLS(X, Y, trainS, Weights)
25     guessY ← S[i][X] × Model.Slope + Model.Intercept
26     Errors[i] ← |S[i][Y] − guessY|

27 S' ← Empty Dataset
28 for i from 0 to N − 1 do
29     for j from 0 to F − 1 do
30         S'[i][j] ← S[i][j]
31     if Errors[i] ≤ E then
32         S'[i][F] ← "GOOD"
33     else
34         S'[i][F] ← Errors[i]
```

FIGURE 3

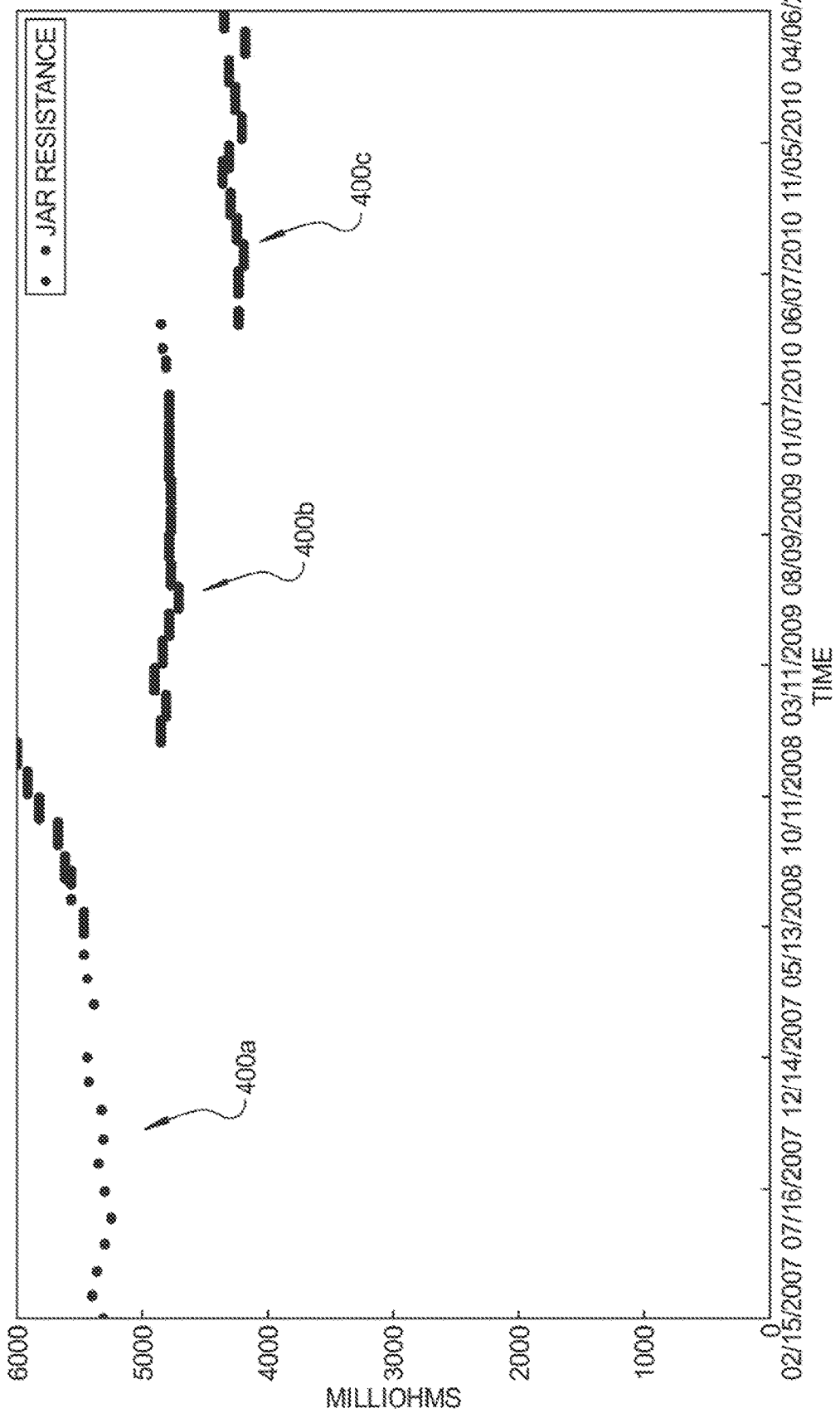

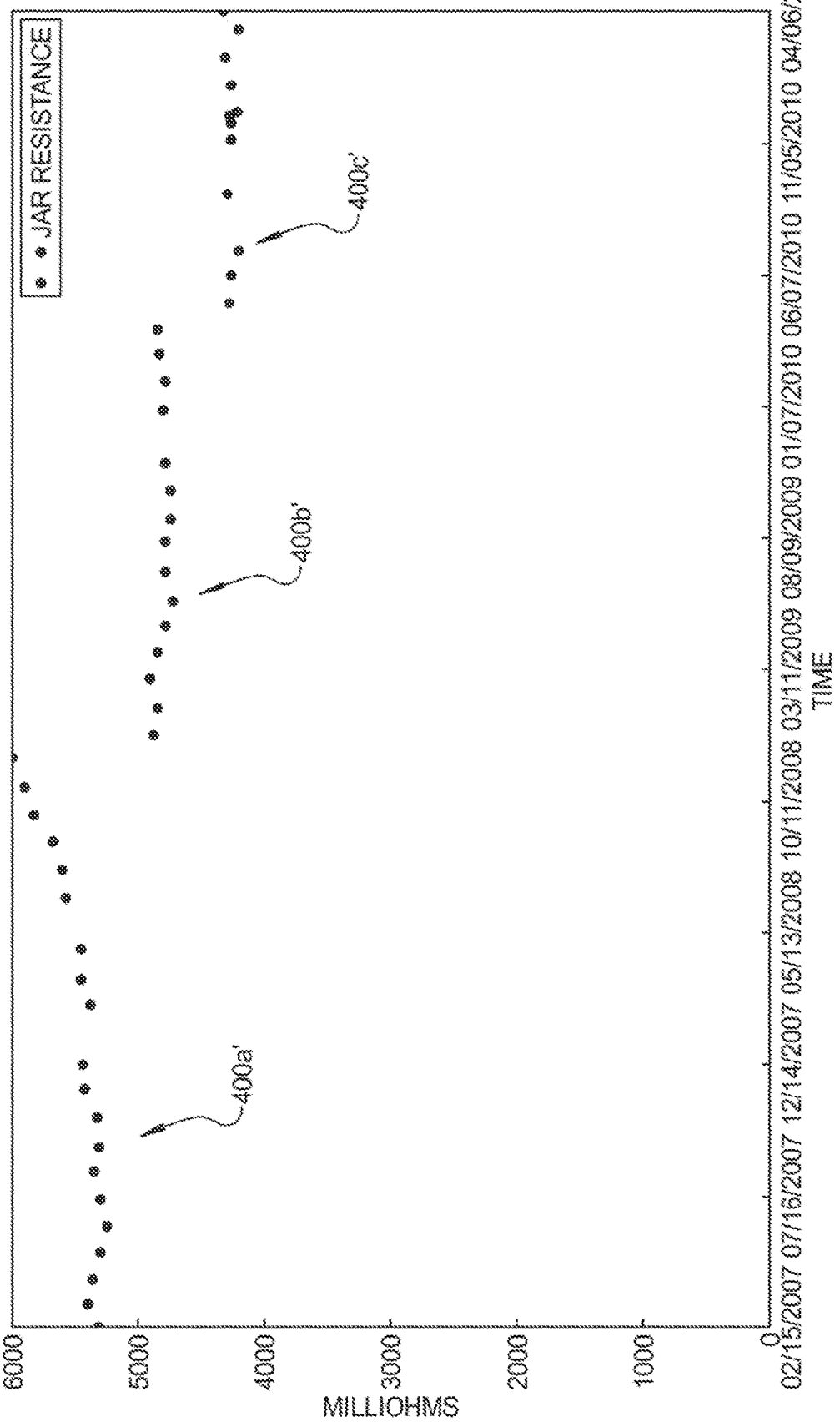

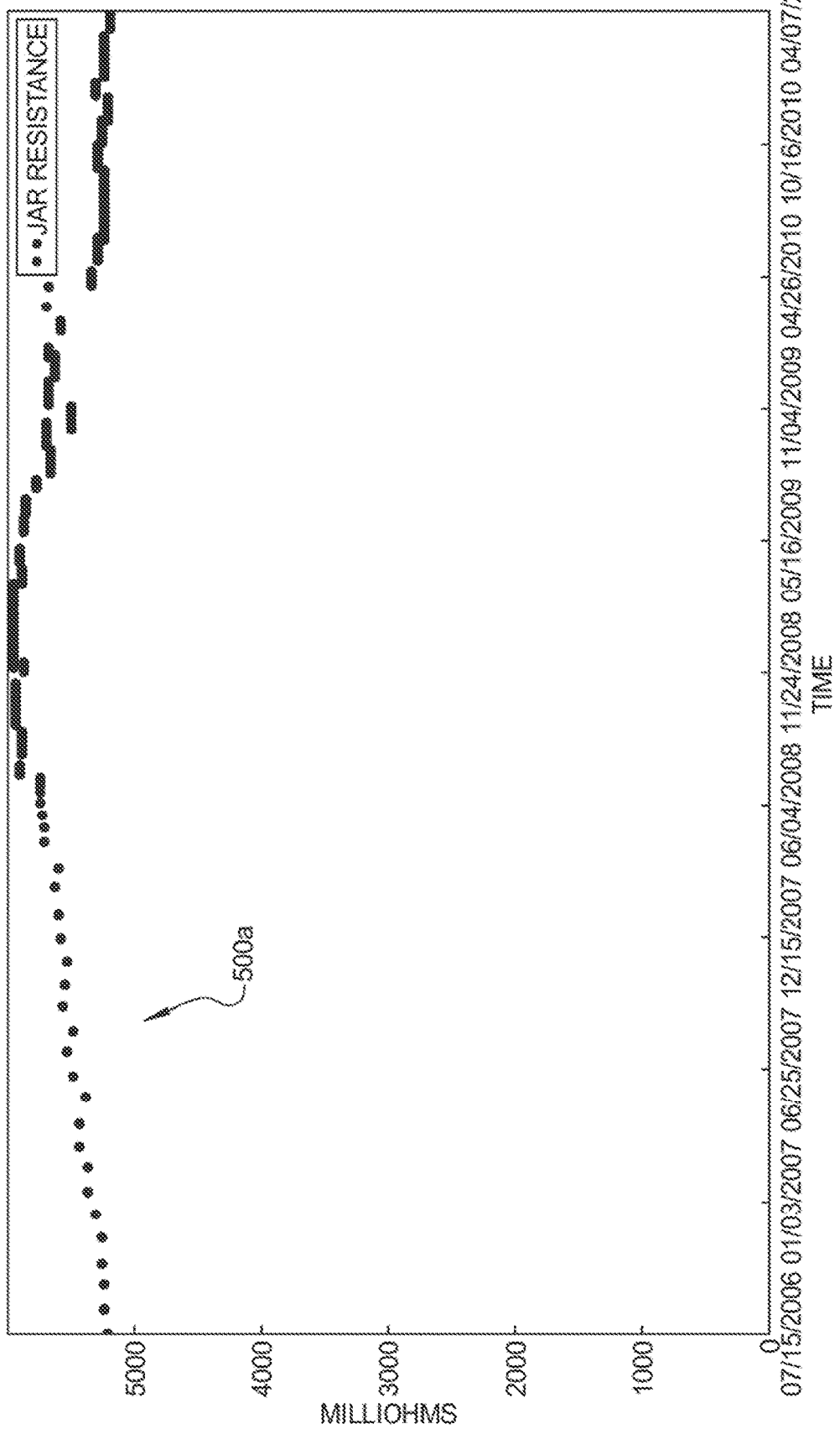

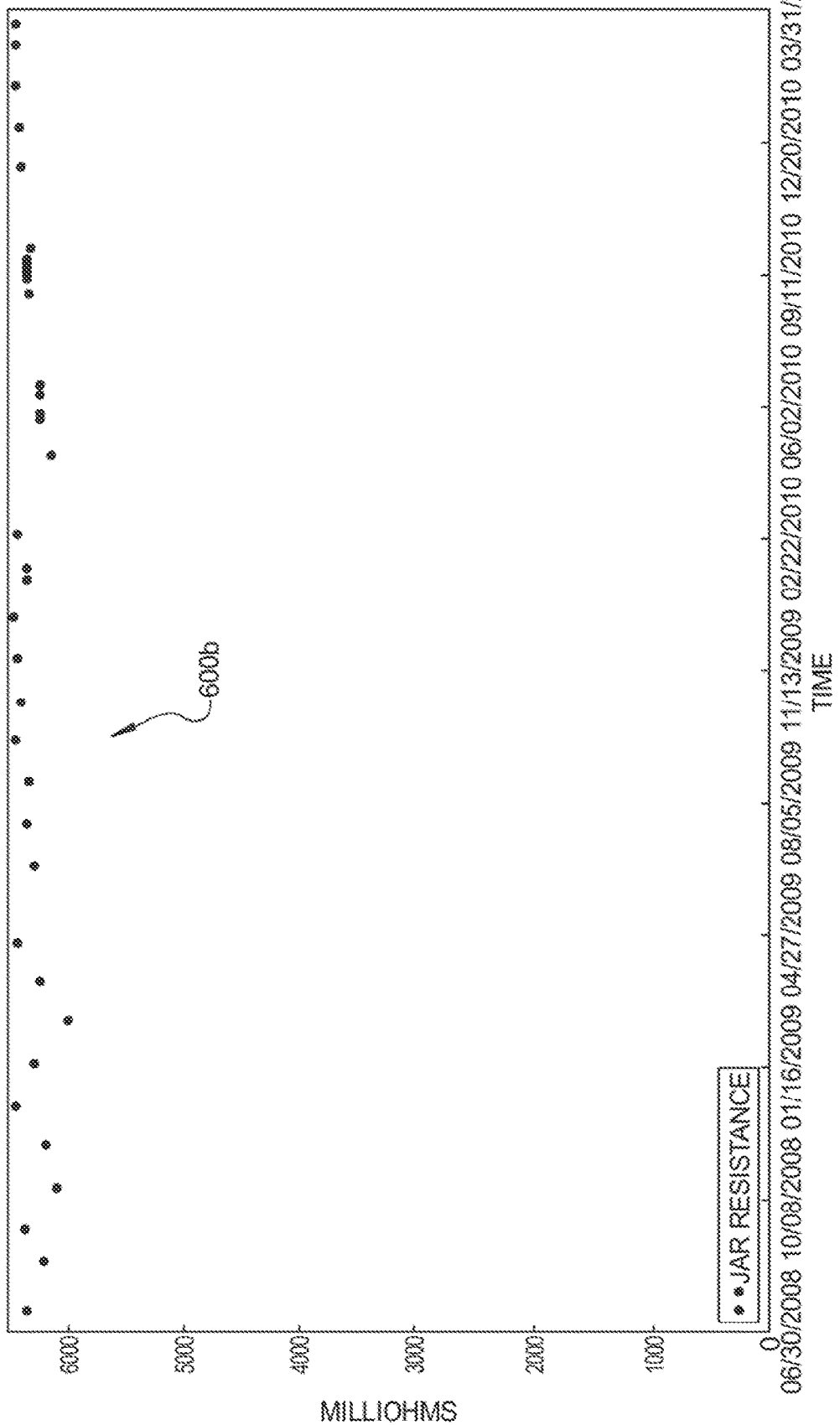

SYSTEM AND METHOD FOR UPS BATTERY MONITORING AND DATA ANALYSIS

CROSS-REFERENCE TO RELATED APPLICATIONS

This application is a § 371 U.S. National Phase of PCT International Application No. PCT/US2014/036812, filed on May 5, 2014, which claims the benefit of U.S. Provisional Application No. 61/819,317, filed on May 3, 2013. The entire disclosures of the above applications are incorporated herein by reference.

FIELD

The present disclosure relates to battery monitoring systems and methods, and more particularly to a battery monitoring system and method for collecting data from uninterruptible power supplies (UPSs) being monitored, and analyzing and filtering the data to produce a data set that even more accurately represents a performance of the UPSs in order to even more effectively predict future system operation and/or a remaining useful life (RUL) of the batteries used in the UPSs.

BACKGROUND

The statements in this section merely provide background information related to the present disclosure and may not constitute prior art.

Many large-scale industrial systems use battery backup systems that allow the machinery to operate through and return to a safe state during emergency loss of the primary power source. These backup systems are typically installed and maintained by third-party firms that monitor battery properties. Many recent installations of Uninterruptible Power Supply (UPS) systems in data centers include permanently-installed, or stationary, instruments (sensors) that continuously collect data from batteries. Since present day data centers can often make use of dozens or more UPSs, with each UPS having a plurality of independent battery cells, when monitoring such large systems around the clock, an extremely large volume of performance data can be generated which needs to be analyzed.

At least three important challenges surround the data collected from present day sensors that are being used to monitor the batteries of UPSs: (1) verifying the quality of the data by distinguishing noise from the valid data that is diagnostic of true battery conditions, (2) refining the identification of data error types so that appropriate diagnoses can be rapidly made and necessary interventions can be undertaken, and (3) identifying and recognizing patterns in valid data in order to make predictions about system operation and remaining useful life (RUL) of batteries. Accurate RUL predictions should increase system uptime by permitting intervention before the batteries actually fail. A significant cost savings may also be realized by changing from periodic inspections of batteries to an inspection cycle that more closely follows the reliability bathtub curve.

When analyzing data collected from a UPS, data noise may result from a variety of events. For example, human intervention such as replacement of a battery or board may result in some degree of data noise being generated. Network failures that prevent proper data streaming, or instrumentation problems such as loose wires, bad sensors, failed multiplexors, disconnected battery lug, altered calibration value, etc., in many instances will also result in data noise. These events may create characteristic patterns in the data stream. At present, a human must attempt to interpret the data and make an effort to identify and report the specific anomalies. As a result, necessary interventions may therefore be delayed until long after the events occur. Automatic cleansing and categorization of data would enable faster determination of root causes of problems (e.g., is it the battery or the instrumentation?) and may be expected to provide a clean dataset on which to build predictive RUL models.

Numerous systems for estimation of battery system health, state of charge, and RUL have been devised. However, such present day systems generally have not been designed to accommodate large datasets of continuous battery measurements such as those arising from automatic monitoring of UPS battery backup systems used in present day data centers. At present, inspection of incoming sensor data from data center battery backup systems is often performed manually by a team of battery experts, both on a routine schedule and in response to alarms. This makes "cleansing" of raw sensor data from battery monitoring systems challenging and frequently time intensive when performed by individuals.

Some prior attempts at analyzing the raw collected sensor data have involved using the well known least-squares linear regression methodology as a form of curve-fitting. The goal of the least-squares linear regression methodology, as with many curve-fitting algorithms, is to find an optimal line which passes close to all the sample points of the collected data. For the least-squares algorithm, "close" may be defined in terms of the errors for each point (that is, the Y distance from each point to the fit line). The least-squares linear regression methodology seeks to minimize the sum of squares of these errors. However, one significant drawback to the least-squares linear regression methodology is that all errors are weighted equally. As a result, an error in one point is just as bad as an error in any other point. Another drawback is that even data points that were created pursuant to some intervention by a user (i.e., disconnecting a battery cable, or momentarily upsetting a battery cable connection) will be considered in the least-squares linear regression curve fitting, when in fact such data points are not indicative of any true performance degradation of the battery string. Outlier data point values are also considered by present day curve fitting algorithms. These factors can cumulatively significantly reduce the quality and reliability of a battery health analysis being drawn from a conventional least-squares linear regression curve fitting.

SUMMARY

In one aspect the present disclosure relates to a method for analyzing raw data collected over a period of time, using a processing/analysis system, to verify a quality of the raw data collected. The method may include collecting raw data point values over a period of time. The processing/analysis system may be used to identify and remove specific ones of the raw data point values determined to be outliers residing outside of a predetermined range of data point values. For each one of the specific remaining ones of the raw data point values, the processing/analysis system may examine at least two other ones of the raw data point values obtained at points in time prior to a given one of the raw data point values being examined. The processing/analysis system may use the at least two other ones of the raw data point values to determine a predicted data point value relative to the given one of the raw data point values being examined, and to compare the predicted data point value and the given one of the raw data point values being examined. From the comparing, the processing/analysis system may be used to determine whether the given one of the raw data point values being examined is a valid data point value.

In another aspect the present disclosure relates to a method for analyzing raw data relating to battery measurement values collected over a period of time, using a processing/analysis system, to verify a quality of the raw data collected. The method may include collecting raw data point values over a period of time using the processing/analysis system. The processing/analysis system may also be used to perform a data cleansing operation by identifying and removing specific ones of the raw data point values determined to be outliers residing outside of a predetermined range of data point values. The processing/analysis system may be used to perform a data condensing operation by examining successive pairs of the raw data point values which were obtained adjacent one another in time, and whenever the two raw data point values of a given successive pair of points are identical, then discarding one raw data point value of the pair being examined, to thus form a condensed collection of raw data point values. From the condensed collection of successive pairs of raw data point values, for each one of said raw data point values of each successive pair, the processing/analysis system may examine a plurality of ones of the raw data point values that were obtained previous in time to a given one of the raw data point values of a pair which is under consideration, and then may assign a weight to each one of the plurality of ones of the raw data point values that were obtained previous in time to create weighted data point values. The processing/analysis system may use the weighted data point values to generate a predicted data point value which is associated with the raw data point value under consideration. The system may further be used to perform a comparison between the predicted data point value and the raw data point value under consideration to determine an error relative to the raw data point value under consideration.

In still another aspect the present disclosure relates to a system for analyzing raw data collected over a period of time to verify a quality of the raw data collected, and to eliminate from further consideration data point values determined to be erroneous data point values. The system may include a processing system configured to run an algorithm, and operable to collect raw data point values over a period of time. A database may be used which is in communication with the processor and which is configured to store the collected raw data point values. The processing/analysis system may further be configured to identify and remove specific ones of the raw data point values determined to be outliers residing outside of a predetermined range of data point values. The processing/analysis system may also be used, for each one of the specific remaining one of the raw data point values, to examine at least two other ones of the raw data point values obtained at points in time prior to a given one of the raw data point values being examined. The at least two other ones of the raw data point values may be used in connection with the algorithm to determine a predicted data point value relative to the given one of the raw data point values being examined. The processing system may use the predicted data point value and the given one of the raw data point values being examined to determine if the given one of the raw data point values being examined is an erroneous data point value.

BRIEF DESCRIPTION OF THE DRAWINGS

The drawings described herein are for illustration purposes only and are not intended to limit the scope of the present disclosure in any way.

FIG. 3 is an example of a prognostic health monitoring ("PHM") algorithm that may be used with the system of FIG. 1 to cleanse and analyze resistance data values collected by the monitoring equipment shown in FIG. 1;

FIGS. 4a and 4b through 9 are graphs indicating how collected data values may be presented, in graphical form, before plotting of error values for each of the collected data values.

DETAILED DESCRIPTION

Figure 1:
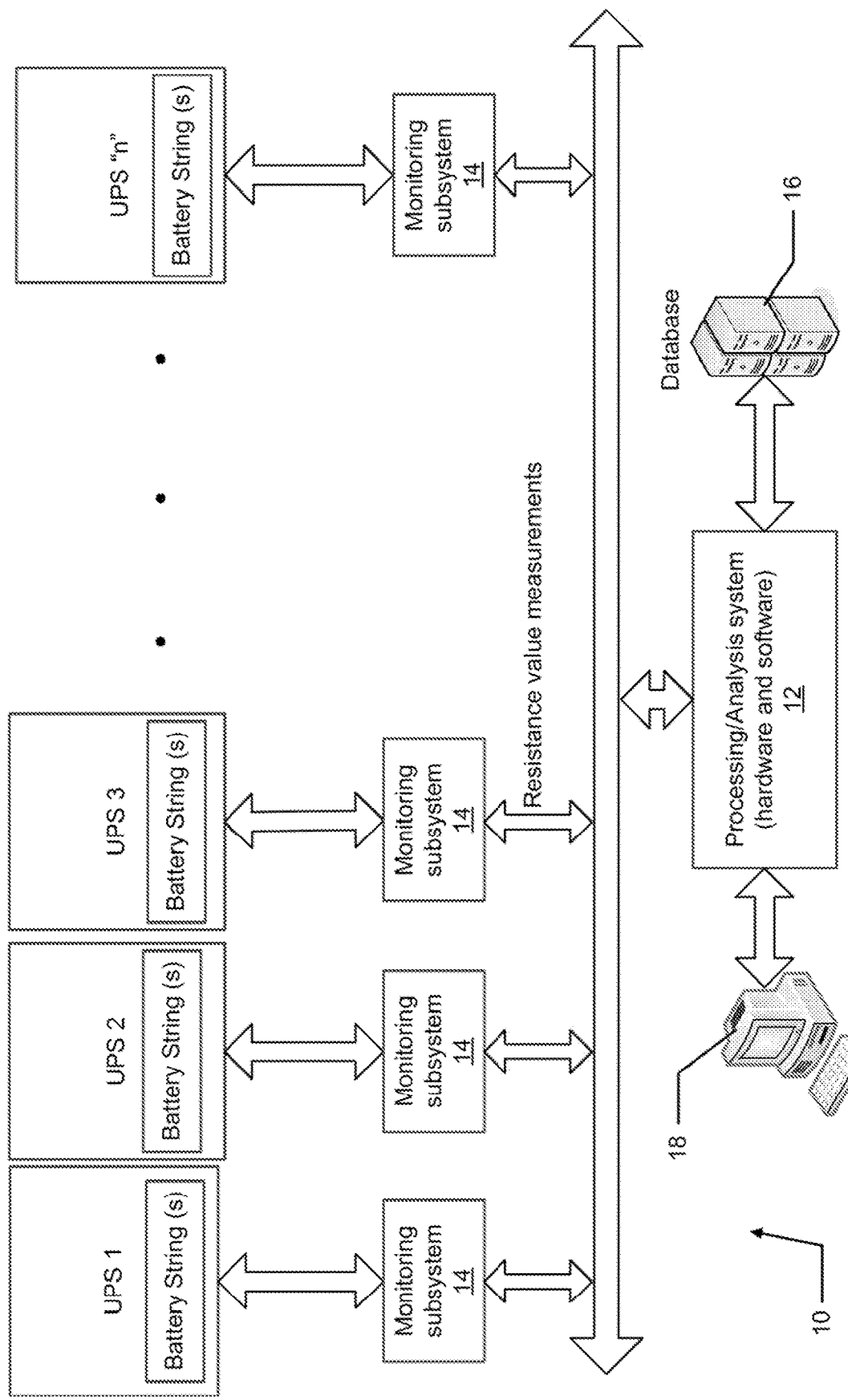
FIG. 1 is a high level block diagram of one system in accordance with one example of a UPS monitoring system in accordance with the present disclosure.

The following description is merely exemplary in nature and is not intended to limit the present disclosure, application, or uses. It should be understood that throughout the drawings, corresponding reference numerals indicate like or corresponding parts and features.

Referring to FIG. 1 there is shown one example of a system 10 for monitoring and analyzing performance data of a plurality of battery strings in each one of a plurality of uninterruptible power supplies (UPSs). The system 10 may include a processing/analysis system 12 (hereinafter simply "processing system 12"), including both hardware and software components, that receives measured battery resistance values obtained by monitoring subsystems 14. The monitoring subsystems 14 may be sensors or any other devices/subsystems that are used to collect the raw battery resistance measurement data that will need to be analyzed. Suitable battery monitoring and diagnostic systems are available from Albercorp of Pompano Beach, Fla. under product numbers BDS40 and BDS256.

The measured battery resistance values obtained may be stored in a database 16 or any other suitable memory component. The processing system 12 may also be in communication with a terminal 18 for displaying the measured battery resistance values. The terminal 18 may comprise without limitation a portion of a PC, a laptop, a tablet or possibly even a smartphone.

Each UPS will typically include at least one battery string. The battery string may be comprised of different numbers of "jars", with a plurality of battery cells making up a single jar. However, the present system 10 is not limited to any one configuration of battery strings. The jars within a battery string are connected in series, which means that the voltage drop across a string is the sum of the individual voltage drops across the jars of a given string. The failure of a single jar will degrade an entire string. Thus, it is important to be able to collect and analyze the battery resistance values from a battery string to be able to predict when a failure is likely to occur so that suitable action can be taken to avoid compromising the integrity of the UPS. However, present day monitoring/analysis systems are not able to analyze the raw battery resistance data collected in a manner that clearly indicates to the user when a potential problem is likely to occur, as compared to other events (i.e., momentarily disconnecting a jar; loose connection, etc.) that would similarly appear, just from looking at the raw collected data, to suggest a potentially imminent failure of a battery string. The system 10 and method of the present disclosure achieves this capability in part through the use of a method for analyzing the collected battery resistance values.

Figure 2:
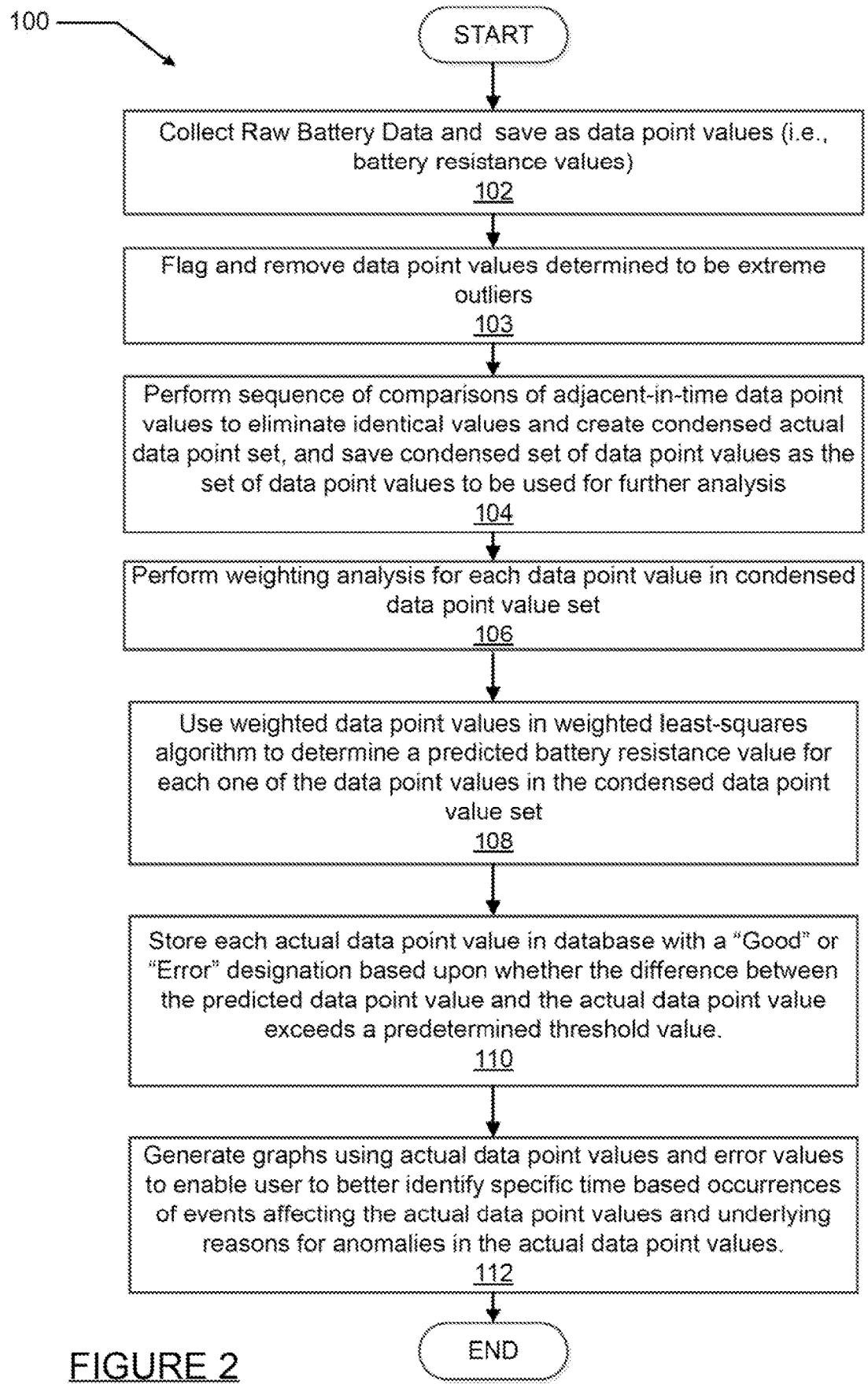
FIG. 2 is a high level flowchart illustrating various operations that may be implemented by the system of FIG. 1.

With the system 10, a plurality of operations may be performed to "cleanse" (i.e., filter) and condense the collected raw data point values before attempting to perform an error analysis on the collected raw data point values. The error analysis may involve a unique methodology for weighting the condensed set of actual data point values prior to making a prediction as to the possible error of each actual data point value. Referring to FIG. 2, a flowchart 100 presents a plurality of high level operations that may be performed by the processing system 12 in condensing and analyzing raw data point values. At operation 102 the raw battery resistance values (i.e., raw data point values) are collected by the monitoring subsystems 14. For this example it will be assumed that the raw data point values from a single battery string of UPS 1 are being considered. At operation 103, data point values are analyzed to identify and remove values that are extreme outliers. This may be accomplished by testing the data in a 3× box/whisker extreme outlier test. This involves comparing all the collected data point values at once. The second quartile (Q2) indicates the median value of all values. The first quartile (Q1) indicates the median value between the lowest value and Q2. The third quartile (Q3) indicates the median value between the highest value and Q2. The inter-quartile-range (IQR) is Q3-Q1. The most relevant data will appear in the IQR, and extreme outliers will be those that are above Q3+3*IQR or below Q1−3*IQR. The extreme outliers are then flagged.

At operation 104 a sequence of comparisons is performed of adjacent-in-time data point values to eliminate identical values and create a condensed data point set. This condensed data point set is the set of data points that is used for further analysis. This may represent a significant reduction in the overall number of data point values that are analyzed but without compromising the accuracy of the results of the analysis.

At operation 106 a weighting analysis may be performed on each data point value in the condensed data point set. This operation, to be described in greater detail in the following paragraphs, may be used to assign different weights to data point values that preceded, in time, a particular data point value under consideration, and which are being used to predict whether the data point value under consideration is a valid data point or an erroneous data point (e.g., a high or low outlier).

At operation 108 the weighted data point values generated at operation 106 are used in a weighted least-squares algorithm to generate a predicted data point value for each one of the data point values in the condensed data point value set. At operation 110, each data point value may then be stored in the database 16 with an additional field in a suitable format, for example a comma separated value (CSV) format. The additional field may have a word or value, for example, "Good" or simply a numeric error value, that indicates the difference between the predicted data point value associated with a specific data point, and the actual resistance value of the data point. At operation 112 the condensed set of data point values may be plotted on a graph along with points indicating the magnitude of the error for each one of the data point values.

A prognostic health monitoring ("PHM") algorithm 200 is shown in FIG. 3 for performing certain ones of the operations described above in connection with FIG. 2. It will be understood that the PHM algorithm 200 may run on the processing system 12 or on any other suitable processor or controller, provided it is able to communicate its results to the terminal 18. For the PHM algorithm 200, the following may apply:

input: S, original dataset with N instances and F features (in this example only a single feature, battery resistance, is addressed)(fields), indexed starting with 0;

X, the index of the field which will be the independent variable (e.g., the reading date);

Y, the index of the field which will be the dependent variable (e.g., the jar resistance value);

A, the age parameter which will be used to create the weights when building the WLS (weighted least squares) model;

E, the error parameter which will be used to decide if an error is significant enough to warrant attention;

output: S', dataset which contains all N instances and F features from S, but also contains an additional field Y' which will contain either the word "GOOD" or a numeric value representing the error in field Y for the given instance.

The PHM algorithm 200 has an underlying premise that for the response variable (i.e., the jar resistance being measured, "Y"), at any given point in time the rate of change should be locally linear, even if the overall function is nonlinear. So it is possible to build a linear model, based on the raw measured (i.e., actual) data point values, which may be used to predict the next point data point value or, put differently, what the next data point value should be. In order to ensure that the model only focuses on local linearity, the preceding data point values points are preferably not used uniformly in building the model, but rather they are weighted exponentially. Thus, closely-adjacent data point values have the highest weighting while more distant points (i.e., data point values much earlier in time than the point under consideration) are weighted to nearly zero. The model, based on a weighted least squares (WLS) algorithm, then uses these weights to minimize the weighted model error. Once the model is built, each predicted data point value is compared to its associated actual data point value, and if this difference exceeds a previously-defined threshold then the point being examined is considered erroneous. This entire sequence of operations (including building the model) is repeated for every instance of the data (i.e., every single actual raw data point value), to find the errors for the entire condensed set of actual raw data point values (i.e., the "dataset").

The analysis performed by the algorithm 200 may involve multiplying each error value by that associated data point value's weight prior to determining an overall error of a calculated regression line. This is useful if different data point values have varying amounts of uncertainty, or if the points are unusual with respect to how far they are from a certain point of interest. The PHM algorithm 200 takes the original (uncondensed) dataset, as well as the indices for fields X and Y and parameters A and E. It should be noted that throughout the PHM algorithm 200, the first index on datasets (for example, the i in S[i][j]) refers to the "ith" instance (zero-indexed), while the second index refers to the "jth" feature (field, also zero-indexed). It is assumed that the X and Y values are appropriate indices into the dataset. Lines 1 through 9 of the PHM algorithm 200 concern the data cleansing operation (operation 104 in FIG. 2) that is performed prior to executing a main error detection algorithm. First the instances are sorted based on the X field, and then each pair of adjacent instances is examined. Each instance will be understood as representing a single actual data point value. If they differ, the second instance is retained in the dataset. If they do not differ the second instance is not retained; that is, only the first instance, which is the earlier in time instance, is retained in the dataset. In either event, the next pair of instances (i.e., actual data point values) is then considered. If the two instances of the next pair are identical in every feature, however, then the second instance of the identical pair is not used. Thus, lines 6 and 7 of the PHM algorithm 200 have the effect of ensuring that no adjacent pairs of instances are entirely identical. It is important to note that only completely identical instances are removed; if the X value is the same but the Y value differs, for example, the instance is retained (even if two instances on the same day with different readings is an error on its own). The foregoing operations of examining adjacent pairs of instances and saving only one or the other of each pair may be thought of as a data "cleansing" or condensing operation to create the condensed set of data point values, also referred to herein simply as the "dataset".

Continuing with FIG. 3, following the above data cleansing/condensing process, lines 10 through 26 of the PHM algorithm 200 operate to effectively build a separate model for each instance of the data set being examined. It should be noted that for the first two instances, only a value of n/a (not applicable) can be produced, because the WLS algorithm requires at least two points to build a model, and since only those points prior to the point being examined are included, such models can only be built starting with the third point. As the PHM algorithm 200 proceeds through the main loop (lines 13 through 26), the first set of points found prior to the point being examined are partitioned out (lines 14 through 16), and then the algorithm 200 checks if the most recent point prior to the point being examined is more than a predetermined time interval earlier than the point being examined (line 18). If so, a variable called "WeightFactor" is defined which is how much longer than a predetermined quantity of time this value is. For example, consider that the predetermined time interval is set to one month (i.e., 2628000 seconds). If there was a 2.5-month span between the most recent actual data point value and the actual data point value being examined, the WeightFactor would be 2.5 minus 1 (resulting in 1.5 months, in seconds), minus 2628000 (line 19 of algorithm 200). If the most recent point is one month or less from the point being examined, however, WeightFactor is set to 0 (line 21 of algorithm 200), so it will have no effect on the algorithm 200.

Following the operation of determining the WeightFactor, the weights for each of the data point values prior to the one being examined are found. The weights for the data point values are based on their distances from the point of interest, "A" (the age parameter), and WeightFactor (lines 22 through 23 of the PHM algorithm 200). The effect of the WeightFactor is to contract the closest point to the point being examined to only one month prior to the point being examined, and to also slide all other points prior in time to the point being examined forward by the same amount. Note this is only done if the immediately-preceding data point is at least one month prior to the point being examined. Because this only affects the weighting (and not the actual underlying data), these changes will only affect the weights used for the currently examined data point, not future data points (which will be tested again with line 18 when the loop of the algorithm 200 enters another cycle).

Finally, the PHM algorithm 200 involves building a WLS model using the partitioned data points, the calculated weights, and the indices to be used as the X and Y fields (line 24). In lines 25 and 26, this model is used to predict the magnitude (i.e., value in resistance) of the instance being examined, and the difference between this predicted value and the actual value is stored in an "Errors" array in the database 16 (FIG. 1).

Once the errors have been calculated, all that remains is to add these into the dataset using the numeric value for those which exceed the E (error) threshold. Lines 27 through 34 perform this operation by first copying all the existing fields into the new S' dataset and then either adding "GOOD" or the numeric error value. This final dataset S' is what the algorithm 200 will return, containing all of the information regarding the errors.

FIGS. 4a and 4b presents a fairly typical case, where the resistance data breaks into three clear data value time sequences: one labeled 400a where it starts a bit over 5000 mΩ and slowly rises; one labeled 400b where it starts at nearly 5000 m° exactly and remains relatively stationary; and finally one labeled 400c where it starts well below 5000 mΩ and also does not show significant movement. Post-cleansing, data value sequences 400a', 400b' and 400c' reveal that the duplicated values are mostly removed. This demonstrates that the data cleansing feature described above can help remove the differences between datasets which share many similar underlying properties.

Figure 5B:
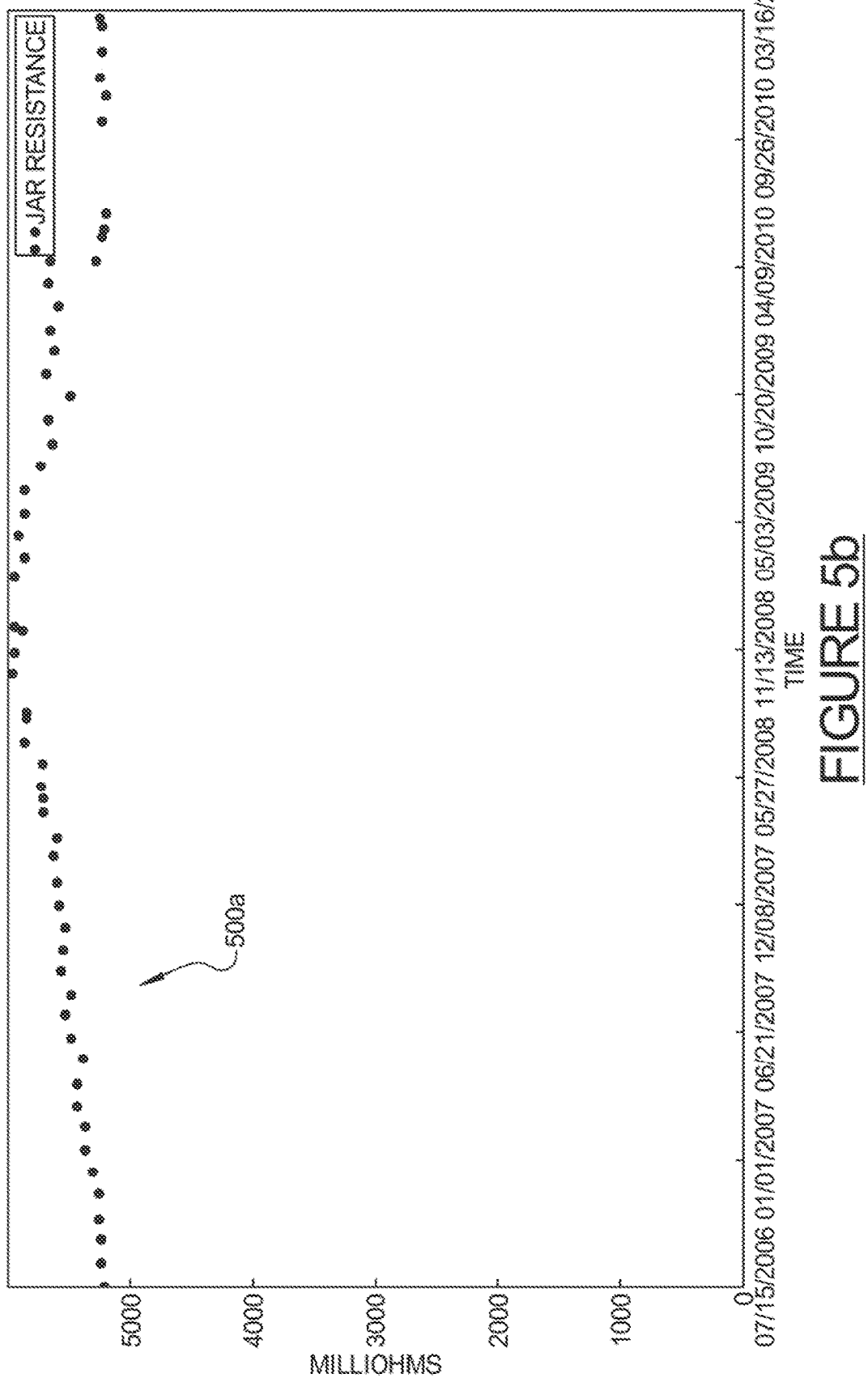

The combination presented in FIGS. 5a and 5b also shows much the same effect of the data cleansing. In FIG. 5a one distinct regime of data 500a is shown. In FIG. 5b, the data regime of FIG. 5a is shown after being cleansed, and is labeled 500b.

Figure 6A:
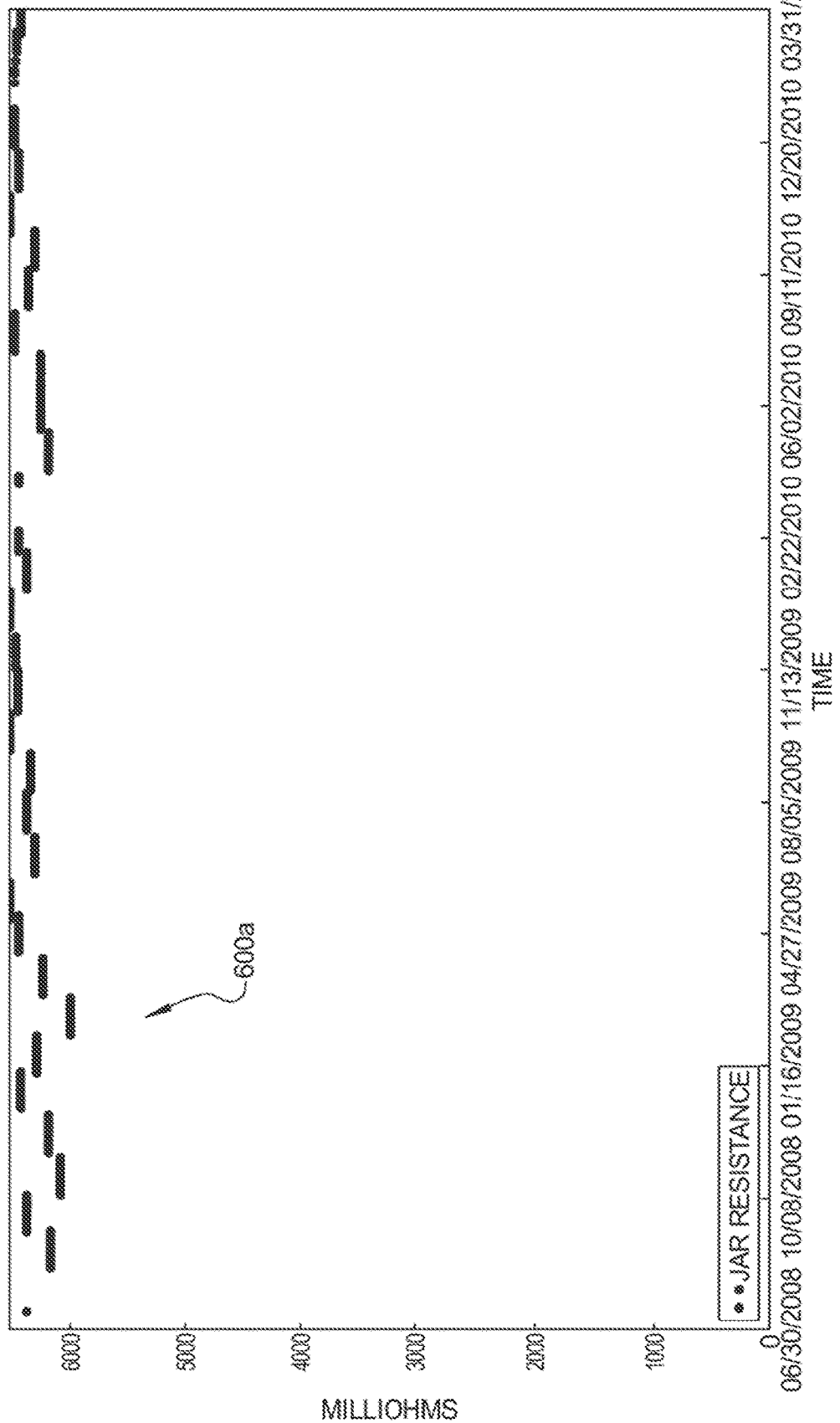

FIGS. 6a and 6b show uncleansed and cleansed data streams 600a and 600b, respectively. This illustrates a relatively constant data source with similar patterns.

Figure 7A:
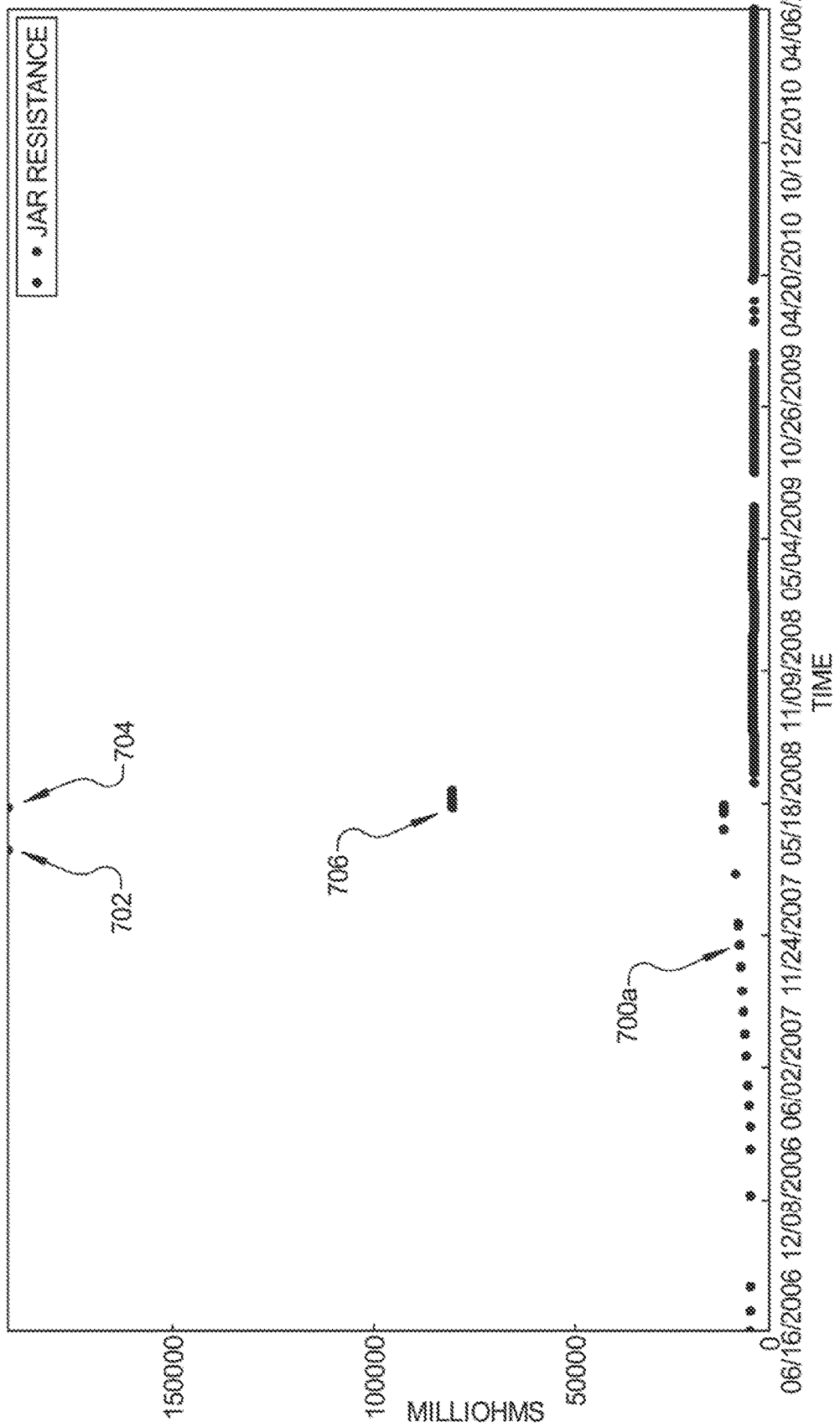
Figure 7B:
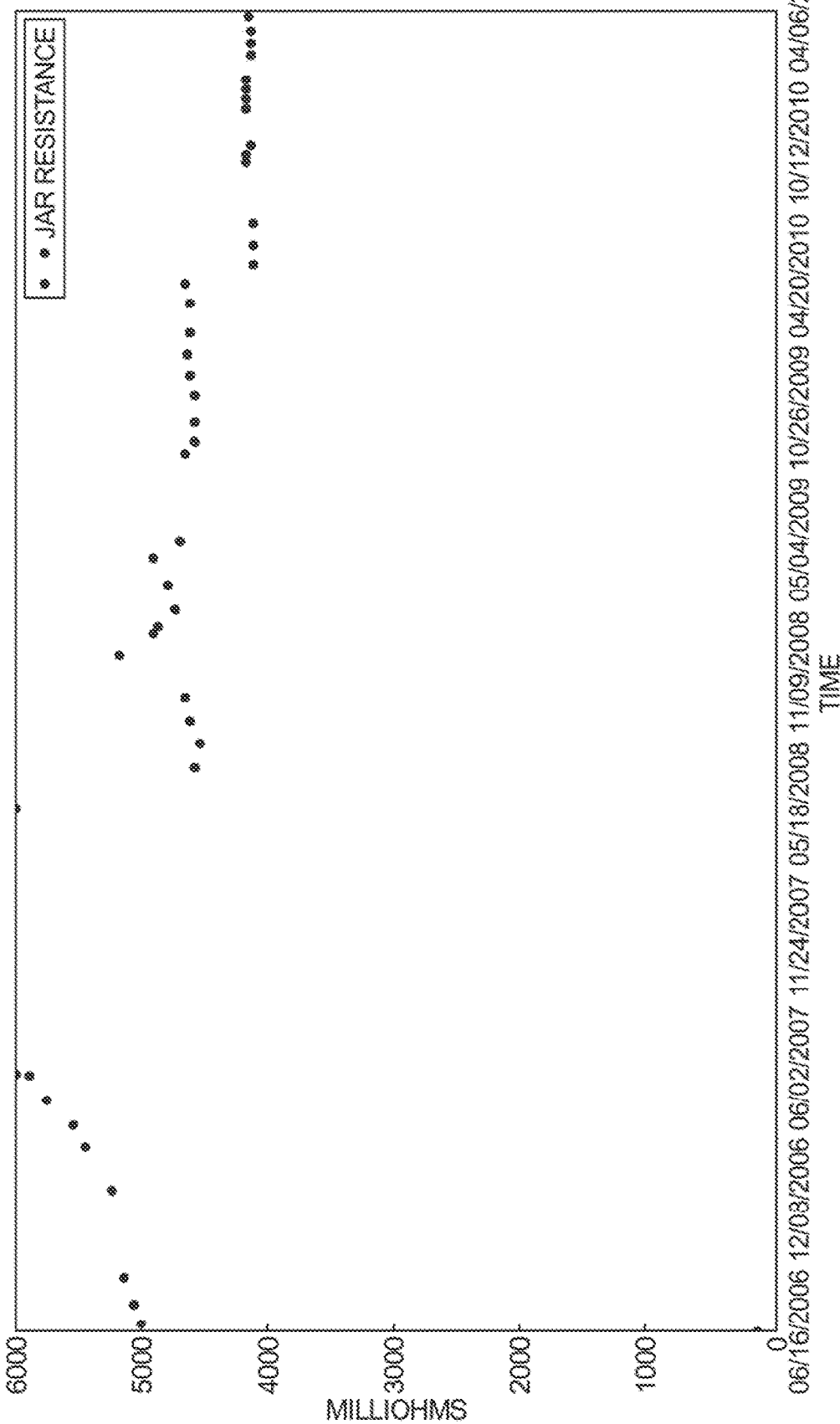
Figure 8:
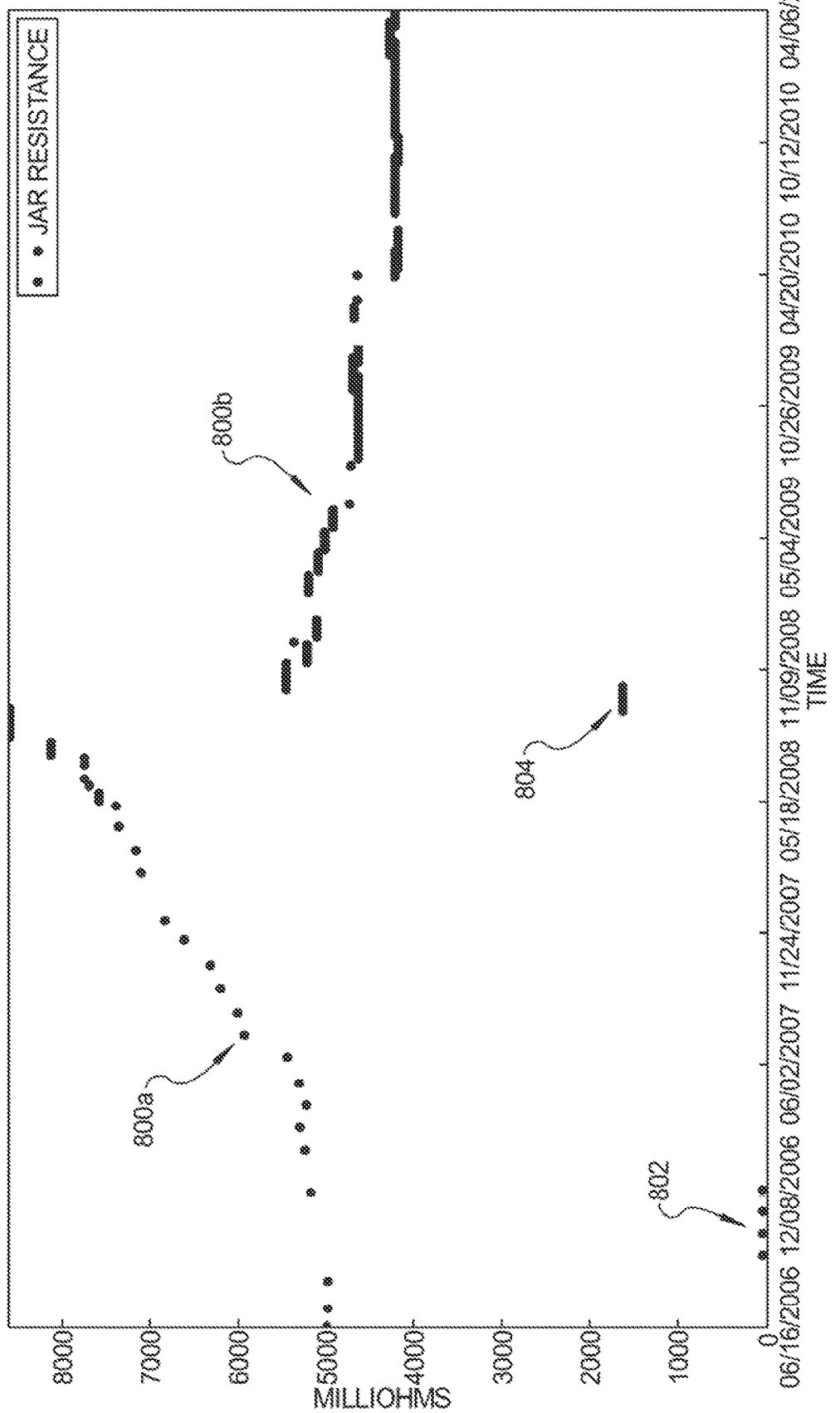
Figure 9:
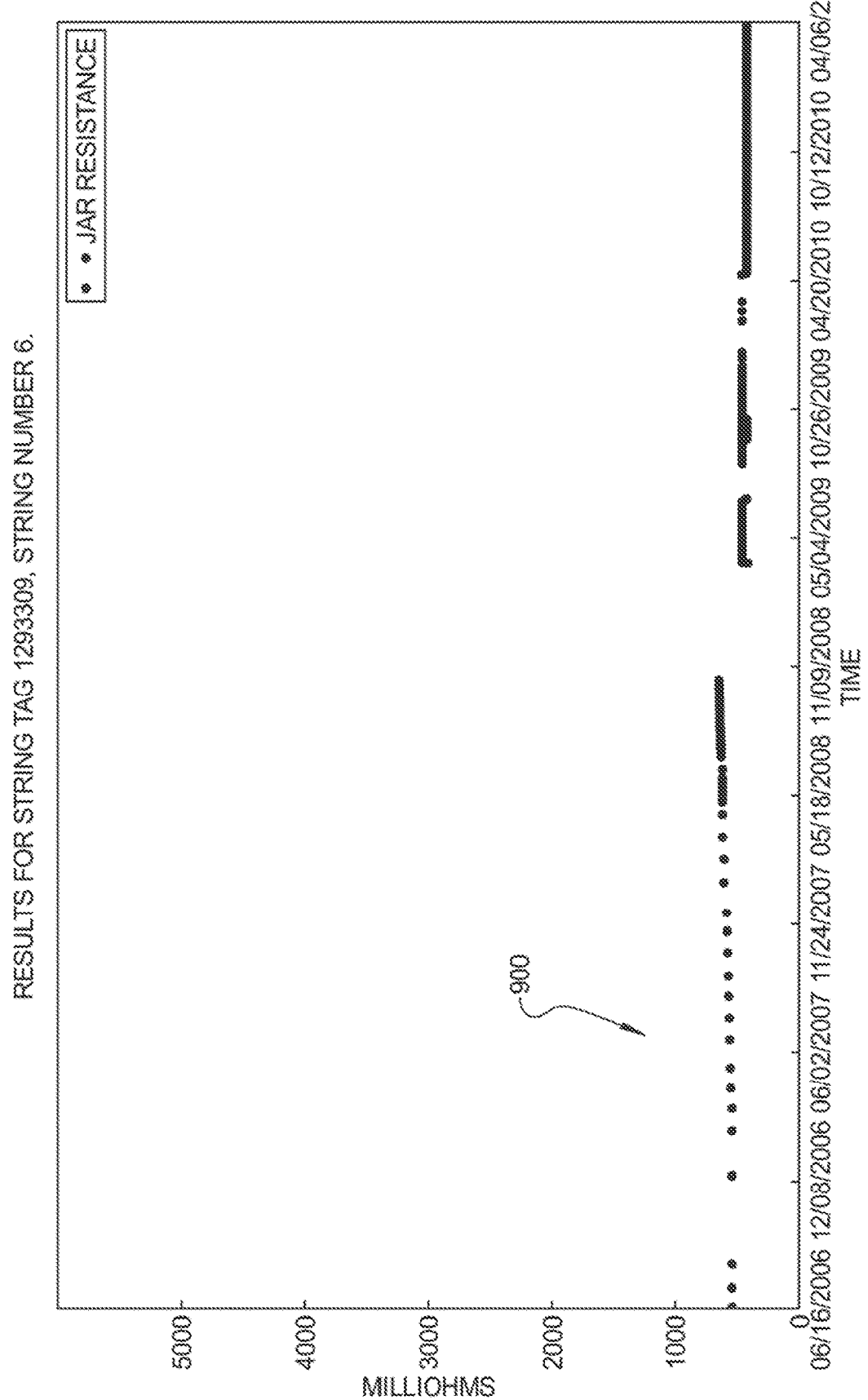

FIGS. 7 through 9 demonstrate the issue of data point outliers. FIG. 7a shows an example with extreme high outliers 702 and 704, as well as one high outlier 706. FIG. 8 shows a data stream 800a with extreme low outliers 802 and 804 that fall in the beginning and in the middle, respectively, of its time sequence. The data stream 900 of FIG. 9 has notable outlier problems in both directions. Note that repeated values in FIG. 9 may present a challenge for automated analysis of sensor data. This is because the frequent repeated values may erroneously lead an algorithm to believe that a signal is more stable than it really is. Outliers, and in particular high outlier values, can obscure human interpretation of sensor data because graphs such as these which scale to the largest observed value are often of minimal help when the highest observed value dwarfs the important values. Thus, by removing these high and low outliers, the resulting data, which can be thought of as a filtered dataset, can be more easily interpreted to find true patterns.

Note that in some cases, such as with the data stream shown in FIGS. 7a and 7b, the removal of outliers can also eliminate some useful values. In particular, this is so for many of the values towards the end of the first data stream 700a, which appear in FIG. 7a to be steadily progressing upwards without creating a true outlier. The cleansed data stream is shown as data stream 700b in FIG. 7b. This is an inherent risk of removing data value instances. However, practitioners could add back the missing data as appropriate or use this to help choose better threshold values for future analysis.

Overall from FIGS. 4-9, it can be seen that, post-cleansing, the important traits of the data are preserved. More specifically, the general pattern of how values change over time is preserved, both smoothly and in discontinuous jumps, but erroneous values which could have led to misleading results (such as duplicated values and extremely high or low values) have been flagged. This will make the processed data easier to interpret both by humans and with automated systems.

Figure 10:
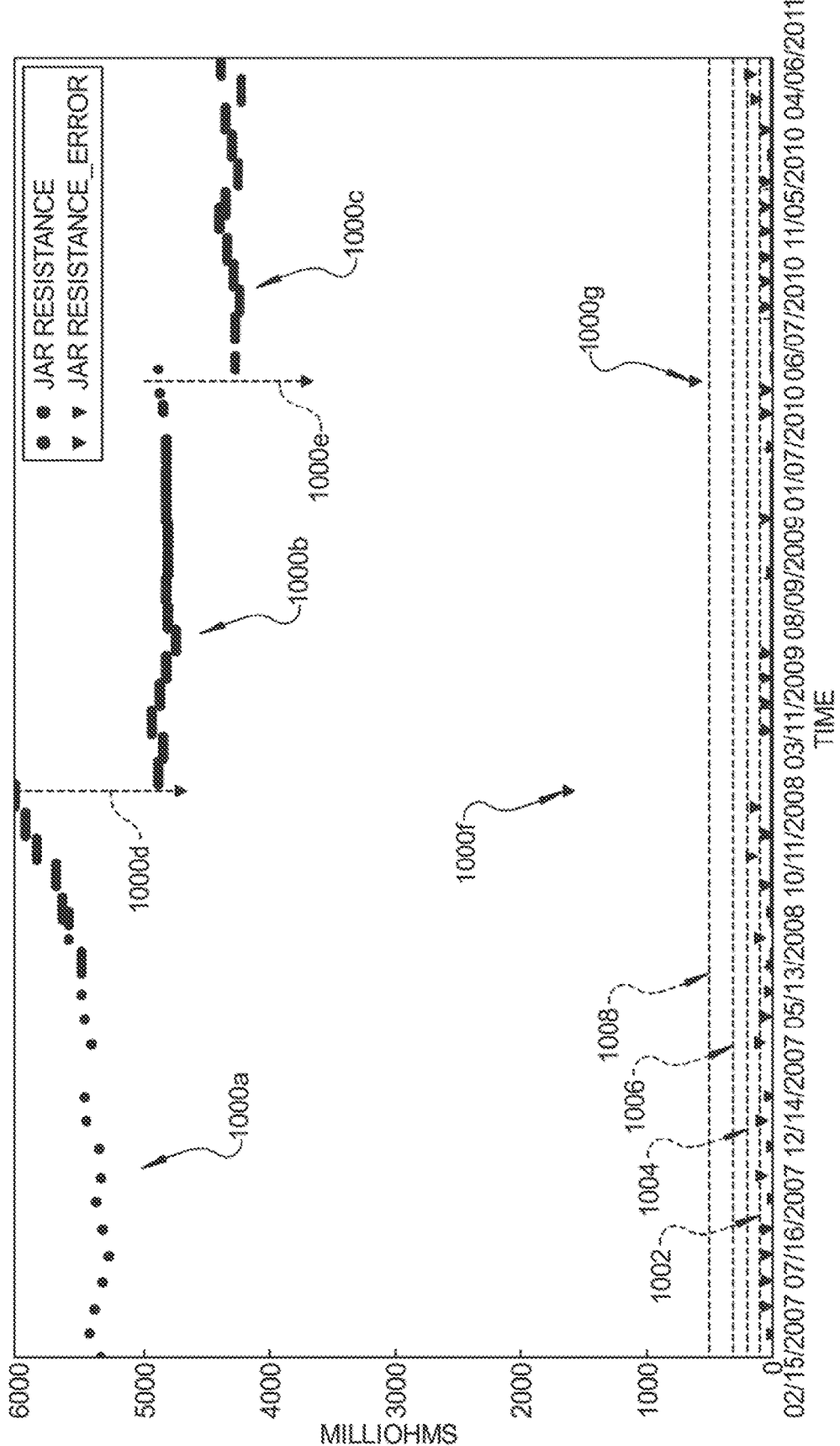
FIGS. 10-13 are output graphs illustrating the data point values plotted relative to their associated error values, and where the error values are being used to indicate high or low outlier data point values as well as discontinuities in the measured jar resistance values.
Figure 11:
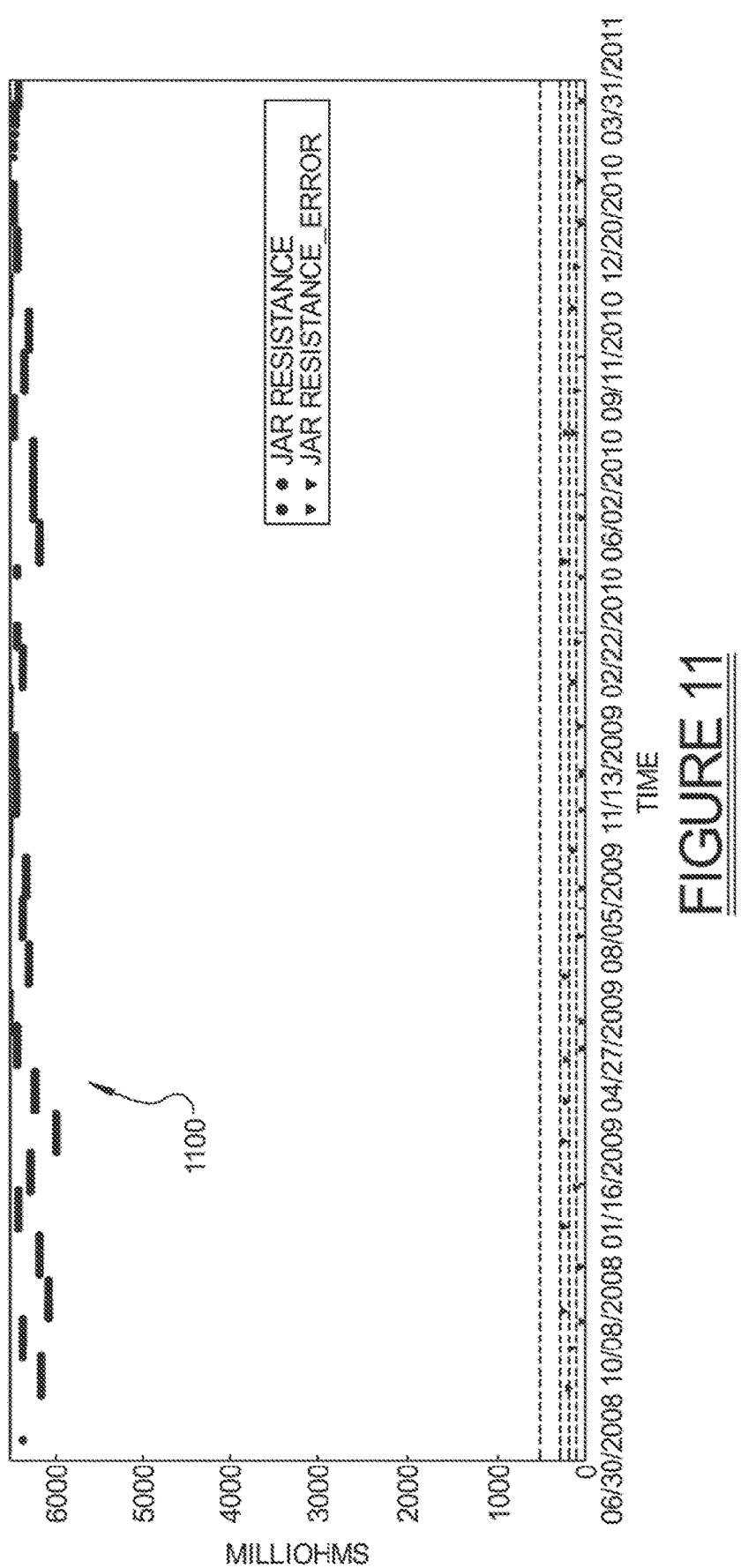
Figure 12:
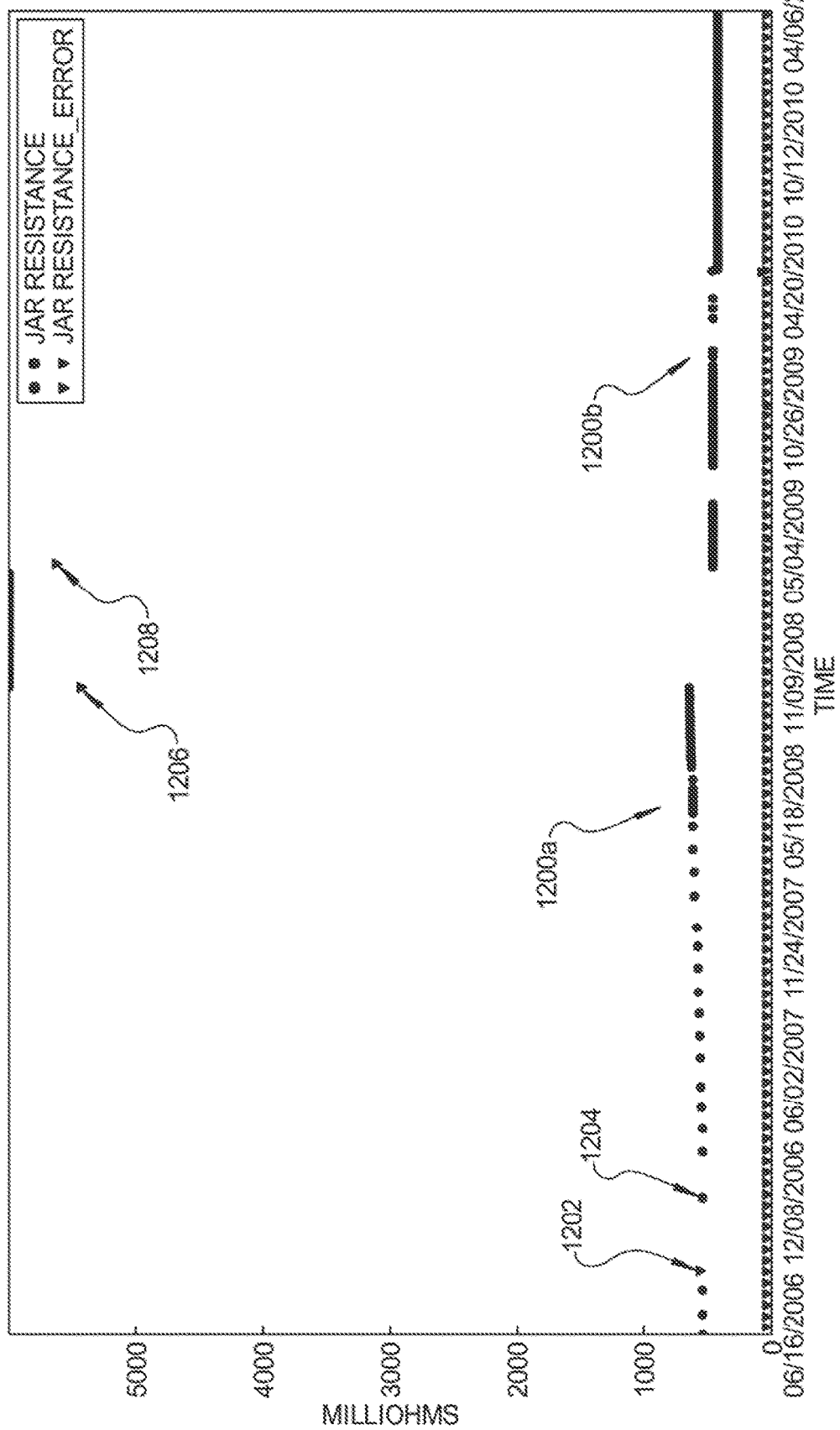

Referring to FIGS. 10-12, output graphs are presented that illustrate the error values relative to each actual data point value of the condensed dataset. Referring initially to FIG. 10, it will be seen that the output graph may present a very clear pattern that may reveal when noise and jumps signal an important event that has occurred with a given jar. In FIG. 10, for example, three distinct data streams 1000a, 1000b and 1000c are present that represent three epochs. Error thresholds 1002, 1004, 1006 and 1008 correspond to values of 100, 200, 300 and 500 mΩ. The initial data stream 1000a shows the expected behavior of a slow rise in jar resistance followed by a sudden increase in the rate of rise followed by a jar replacement event 1000d. The following two data streams 1000b and 1000c do not show as sharp a rise, but the jar replacement event 1000e between them is nonetheless clear. Error values 1000f and 1000g underscore this: these are the only two data value instances that rise above the threshold value of 200 ma, specifically those instances which mark the beginning of a new epoch. This demonstrates how the proposed PHM algorithm 200 can detect jar replacement events autonomously and without human intervention.

As a counterpoint, the output graph 1100 shown in FIG. 11 demonstrates how the PHM algorithm 200 acts when there are no significant changes in the data point values. A few minor jumps are visible as each run of identical values changes, but not changes of the magnitude seen in the previous data. The PHM algorithm 200 does not report dramatic changes; although some error points register between the threshold values of 200 and 300 mΩ, none exceed 300 mΩ. This provides an important control, showing that the PHM algorithm will not produce false positives when it encounters minor jumps.

FIG. 12 demonstrates another benefit of the PHM algorithm 200, that being the ability to detect unusual data value outliers. The dataset shown in FIG. 12 has two regions, 1200a and 1200b, with erroneous values: one, during region 1200a, which spans the last quarter of 2006, contains instances with zero resistance. The other region 1200b, towards the first half of 2009, contains extremely high outlier data values. In both cases the error values (shown as inverted triangles) highlight these issues. When the span of zero-valued instances begins, markedly elevated error value 1202 indicates that a resistance value was expected that was similar to the range seen previously, rather than zero. And when the low resistance range ends, this is indicated by error value 1204. The range of high outliers begins, as noted by error value 1206, and its end is denoted by error value 1208. Note that in both cases the end of a span of erroneous values, and a return to a more typical range, is signified by an instance marked as erroneous (i.e., error values 1204 and 1208). This is because the PHM algorithm 200 does not explicitly know beforehand what appropriate data values are, but it is able to recognize when a data value has changed significantly (i.e., by a suspiciously high or low degree). Additional human intervention may be used to recognize whether the battery is changing from good to bad or from bad to good.

Figure 13:
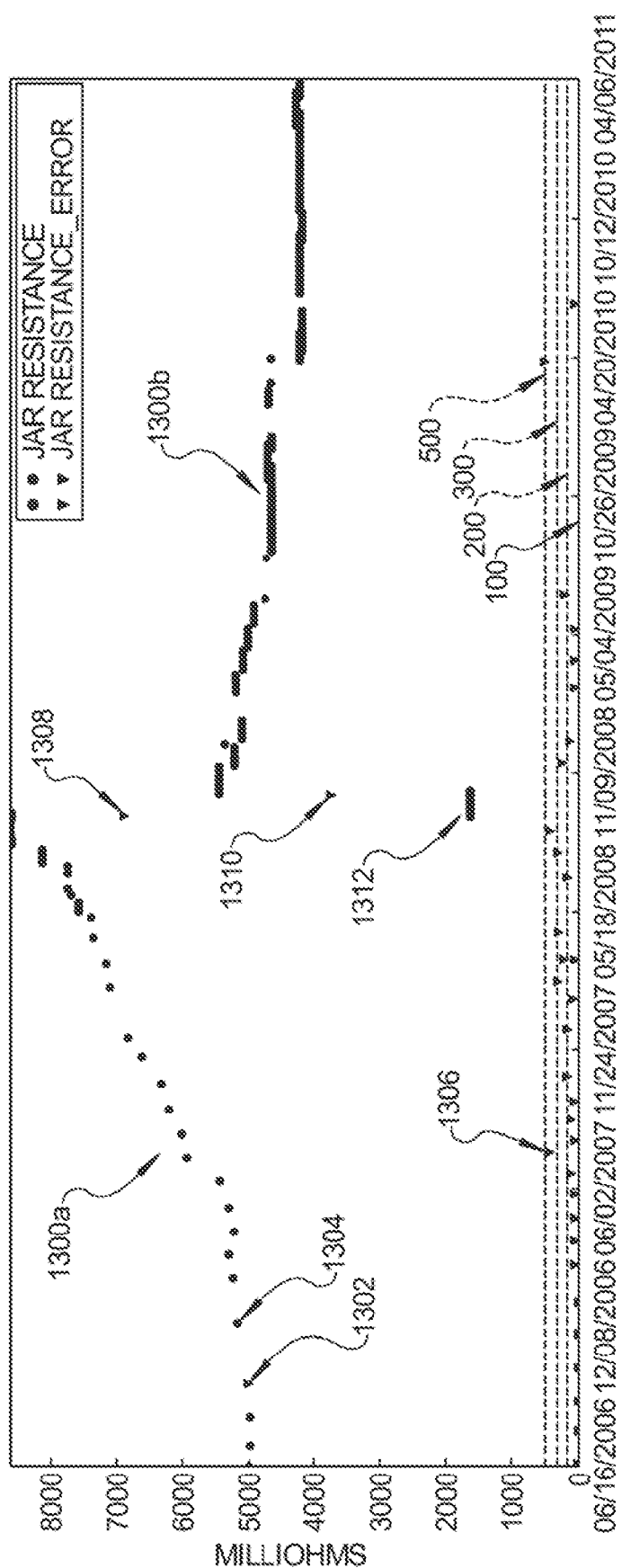

The data values presented in FIG. 13 show how noise and resistance value jumps can be detected in a single file. Three erroneous instances (with resistance values of 0) are found in the latter part of the 2006 time frame, and a large error value 1302 is apparent that denotes the beginning of this epoch, while another large error value 1304 denotes the end of this epoch. It can also be seen that although the slight jump in mid-2007 is noted (error value marked 1306), it does not rise above the error threshold of 500. But the transition from a first data value epoch 1300a to a second data value epoch 1300b is interrupted by a string of erroneous values. Error flags (i.e., inverted triangles 1308, 1310 and 1312) denote these instances. The error flags 1308, 1310 and 1312 flag data point values having abnormally low resistance, which unmistakably signals a significant event occurring with respect to a given jar.

Overall, the system 10 and its PHM algorithm 200 demonstrate how changes in resistance values of a jar can be detected in an automated fashion, and how the system 10 is resistant to noise and able to detect extreme examples of noise. In addition, the threshold value of 500 mΩ has been found to be a generally appropriate value for distinguishing between true jumps and errors as opposed to false positives. And while some sub-critical jumps have been found with error values below 500 mΩ, all important instances have values above this amount. These properties make the system 10 and the PHM algorithm 200 well-suited to identifying unusual behavior in a large-scale monitoring facility because noisy instances can be flagged for human operators without requiring that all data first be processed by hand.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A computer implemented method for analyzing raw data collected over a period of time, using an electronic processing/analysis system incorporating hardware and software, to verify an integrity of the raw data collected, wherein the raw data relates to battery measurement values of a battery string of a battery powered component, the method including:

using a monitoring system to collect raw data point values from the battery string over a period of time;

using the hardware and software of the electronic processing/analysis system:

to identify and remove specific ones of said raw data point values determined to be outliers residing outside of a predetermined range of data point values; and for each one of said specific remaining ones of the raw data point values:

to identify at least two other ones of the raw data point values obtained at points in time prior to a given one of the raw data point values which is being examined;

to examine the at least two other ones of the raw data point values to determine therefrom a predicted data point value relative to the given one of the raw data point values being examined;

to compare the predicted data point value and the given one of the raw data point values being examined;

from the comparing, determine whether the given one of the raw data point values being examined is a valid data point value;

wherein the operation of examining at least two other ones of the raw data point values comprises examining at least two adjacent in time ones of the raw data point values and using the hardware and software of the electronic processing/analysis system to electronically determine and assign a weight to each, the hardware and software of the electronic processing/analysis system assigning different weights to the two adjacent in time ones of the raw data point values, to produce weighted data point values;

further using the electronic processing/analysis system to use the weighted data point values and the predicted data point values to improve an understanding of the raw data point values, to electronically obtain an improved determination of a health of the battery string for the purpose of making a more accurate determination if a failure of the battery string is likely to occur, and to enable action to be taken to avoid compromising an integrity of the battery powered component; and wherein the electronically determining and assigning of different weights using the electronic processing/analysis system to assign different weights to the two adjacent in time ones of the raw data point values comprises assigning a greater weight to a specific one of the two other ones of raw data points which is closes to the given one of the raw data point values.

2. The method of claim 1, wherein the weighted data point values are used in an algorithm executed by the electronic processing/analysis system to generate the predicted data point value.

3. The method of claim 2, wherein the algorithm comprises a weighted least squares algorithm.

4. The method of claim 1, wherein each said one of the remaining ones of the raw data point values is stored in a database together with information indicating an accuracy thereof relative to its associated said predicted data point value.

5. The method of claim 1, wherein the examining of the two closest in time raw data point values comprises determining if the two closest in time raw data point values are identical, and if so, then discarding one of the two closest in time raw data point values.

6. The method of claim 5, further comprising reducing the set of raw data point values by examining successive adjacent pairs of the raw data point values collected over the period of time, and for each said adjacent pair of the raw data point values, making a determination if the raw data point values of the adjacent pair under consideration are identical, and when the adjacent pair of raw data point values under consideration is determined to be identical, then discarding one of the two raw data point values.

7. The method of claim 6, further comprising when the adjacent pair of raw data point values under consideration is determined to be identical, then discarding one of the pair that is closest in time to the given one of the raw data point values.

8. The method of claim 1, wherein each said raw data point value is plotted on a graph along with an indication of an error relative to its associated said predicted data point value.

9. A computer implemented method for analyzing raw data relating to battery measurement values collected over a period of time, using an electronic processing/analysis system, to verify a quality of the raw data collected, wherein the raw collected data relates to battery measurement values of a battery string of a battery powered component, to improve an understanding of the raw collected data to better evaluate a health of the battery string, the method including:

using a monitoring system to collect raw data point values from the battery string over a period of time;

using the electronic processing/analysis system:
to perform a data cleansing operation by identifying and removing specific ones of said raw data point values determined to be outliers residing outside of a predetermined range of data point values;

to perform a data condensing operation by identifying and examining successive pairs of the raw data point values which were obtained adjacent one another in time, and whenever the two raw data point values of a given pair are identical, then discarding one said raw data point value of the pair being examined, to thus form a condensed collection of raw data point values;

from the condensed collection of raw data point values, for each one of said raw data point values:
using the hardware and software of the electronic processing/analysis system to identify a plurality of ones of the raw data point values that were obtained previous in time to a given one of the raw data point values under consideration;

using the hardware and software of the electronic processing/analysis system to examine and assign a weight to each one of the plurality of ones of the raw data point values that were obtained previous in time to create weighted data point values;

causing the hardware and software of the electronic processing/analysis system to use the weighted data point values to generate a predicted data point value which is associated with the raw data point value under consideration;

using the hardware and software of the electronic processing/analysis system to perform a comparison between the predicted data point value and the raw data point value under consideration to determine an error relative to the raw data point value under consideration;

further using the electronic processing/analysis system to evaluate the weighted data point values and the predicted data point values to improve an understanding of the raw data point values, to obtain an improved determination of a health of the battery string for the purpose of making a more accurate determination, by using the processing/analysis system, if a failure of the battery string is likely to occur, and to enable action to be taken to avoid compromising an integrity of the battery powered component; and if the error exceeds a predetermined threshold, then using the electronic processing/analysis system to determine that the raw data point value under consideration is an erroneous data point value.

10. The method of claim 9, wherein the operation of determining whenever the two raw data point values of a given pair are identical, and then discarding one said raw data point value of the pair being examined, comprises discarding the one said raw data point value that is earlier in time than the other.

11. The method of claim 9, wherein the operation of assigning a weight to each one of the plurality of ones of the raw data point values that were obtained previous in time to create weighted data point values comprises assigning higher weights to ones of the plurality of the raw data point values that are closer in time to the raw data point value under consideration.

12. The method of claim 11, further comprising assigning a weight to each one of the plurality of ones of the raw data point values based on whether how much earlier in time each said one of the plurality of ones of the raw data point values are relative to the raw data point value under consideration, such that the earlier in time ones of the plurality of ones of the raw data point values have higher weights assigned therewith than later in time acquired ones of the plurality of ones of the raw data point values.

13. The method of claim 12, wherein each said one of the plurality of ones of the raw data point values is evaluated against a fixed time threshold representing a fixed time period, and the weights assigned to each of the plurality of ones of the raw data point values are based on a difference between the fixed time threshold and a time that each said one of the plurality of raw data point values exceeds the fixed time threshold.

14. The method of claim 9, wherein using the weighted data point values to generate a predicted data point value which is associated with the raw data point value under consideration comprises using a weighted least squares algorithm to generate each said predicted data point value.

15. The method of claim 9, further comprising plotting the raw data point value under consideration along with its corresponding said predicted data point value to visually illustrate an error there between.

16. A system for analyzing raw data collected over a period of time from a battery string of battery powered component, to verify a quality of the raw data collected and to eliminate from further consideration data point values determined to be erroneous data point values, to assist in determining a health of the battery string, wherein the raw data collected is battery measurement values taken from the battery string, the system including:
   an electronic processing system including hardware and software and configured to run an algorithm, and operable to collect raw data point values from the battery string over a period of time;
   a database in communication with the electronic processing system and configured to store the collected raw data point values in a memory;
   the hardware and software of the electronic processing system further being configured to:
     identify and remove, through electronic processing operations, specific ones of said raw data point values determined to be outliers residing outside of a predetermined range of data point values;
     for each one of said specific remaining one of the raw data point values, examine at least two other ones of the raw data point values obtained at points in time prior to a given one of the raw data point values being examined, and assigning different weights to each depending on which one is closer in time to the given one of the raw data point values being examined, to create weighted data point values;
     use the weighted data point values in connection with the algorithm to electronically determine a predicted data point value relative to the given one of the raw data point values being examined;
     use the predicted data point value and the given one of the raw data point values being examined to electronically assess the predicted data point value and the given one of the raw data point values to determine if the given one of the raw data point values being examined is an erroneous data point value; and
   causing the electronic processing system to use the weighted data point values and the predicted data point values to assess a health of the battery string for the purpose of making a more accurate determination if a failure of the battery string is likely to occur, and to enable action to be taken to avoid compromising an integrity of the battery powered component.

17. The system of claim 16, wherein the electronic processing system uses the algorithm to assign the weights such that said ones of the raw data point values that are closest in time to the given one of the raw data point values are assigned higher weights than those ones of said raw data point values that are farthest in time from the given one of the raw data point values.

* * * * *